(12) United States Patent
Yoshiike et al.

(10) Patent No.: US 6,720,645 B2
(45) Date of Patent: Apr. 13, 2004

(54) SEMICONDUCTOR DEVICE

(75) Inventors: Kazuaki Yoshiike, Tokyo (JP); Shuichi Yamanaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/259,641

(22) Filed: Sep. 30, 2002

(65) Prior Publication Data

US 2003/0214025 A1 Nov. 20, 2003

(30) Foreign Application Priority Data

May 16, 2002 (JP) ........................................ 2002-141529

(51) Int. Cl.[7] .............................................. H01L 23/48
(52) U.S. Cl. ........................ 257/692; 257/673; 257/669; 257/674
(58) Field of Search ................................ 257/673, 669, 257/674, 692

(56) References Cited

U.S. PATENT DOCUMENTS

| | | | | | |
|---|---|---|---|---|---|
| 3,868,724 A | * | 2/1975 | Perrino | ........................ | 257/673 |
| 4,151,543 A | * | 4/1979 | Hayakawa et al. | .......... | 257/673 |
| 5,334,858 A | * | 8/1994 | Wada | .......................... | 257/48 |
| 5,641,996 A | * | 6/1997 | Omoya et al. | .............. | 257/787 |
| 5,726,491 A | * | 3/1998 | Tajima et al. | ............... | 257/668 |
| 5,767,571 A | * | 6/1998 | Kimura et al. | .............. | 257/668 |
| 6,084,291 A | * | 7/2000 | Fujimori | ...................... | 257/668 |

FOREIGN PATENT DOCUMENTS

| | | | | |
|---|---|---|---|---|
| JP | 4-158564 | * | 6/1992 | .................. 257/783 |
| JP | 4-323838 | * | 11/1992 | .................. 257/783 |
| JP | 08-008307 | | 1/1996 | |
| JP | 11-040605 | | 2/1999 | |
| JP | 11-307594 | | 11/1999 | |
| JP | 2001-250842 | | 9/2001 | |

* cited by examiner

Primary Examiner—Jasmine Clark
(74) Attorney, Agent, or Firm—Volentine Francos, PLLC

(57) ABSTRACT

In a semiconductor device, and a fabrication method thereof, a semiconductor element having bumps is mounted to a rear side of a base film. A plurality of inner leads are formed at a front side of the base film and located at peripheral portions of the semiconductor element. The inner leads are electrically connected with the bumps of the semiconductor element from the rear side of the base film. Apertures for connection of the bumps of the semiconductor element with the inner leads are provided at the base film. The apertures for connection are provided at locations which exclude locations of distal end portions of the inner leads. The distal end portions of the inner leads are fixed to the base film. The bumps of the semiconductor element and the base film are electrically connected through the apertures for connection from the rear surface.

15 Claims, 16 Drawing Sheets

SEMICONDUCTOR DEVICE

BACKGROUND OF THE INVENTION

1. Field of the Invention

The present invention relates to a semiconductor device to be used as a TCP (tape carrier package), and to a fabrication method thereof.

2. Description of the Related Art

Conventionally, TCPs have served as a way of mounting semiconductor elements. In such a TCP, as shown in FIGS. 15, 16A and 16B, a quadrangular semiconductor element 112 is mounted from a rear side of a TCP tape carrier 116. At the semiconductor element 112, bumps 114 (electrodes) for electrical connection to the exterior are formed on unillustrated bonding pads. The TCP tape carrier 116 is constituted with a base film 118 (a tape-form member), inner leads 120 and a resist 122. The base film 118 is formed of polyimide or the like. The inner leads 120 are formed at a rear side of the base film 113 and electrically connect between the semiconductor element 112 and the bumps 114. The resist 122 is formed so as to protect the inner leads 120. A device hole 124 is provided in the base film 118 for checking and positioning a front surface of the semiconductor element 112 when the semiconductor element 112 is mounted at the base film 118. The inner leads 120 are formed in shapes such that distal end portions thereof protrude into the device hole 124. The distal end portions of the inner leads 120 are structured so as not to be fixed anywhere before bonding at the bumps 114 of the semiconductor element 112. Consequently, there are many cases in which problems of deformation of the distal end portions of the inner leads 120 occur due to heating at a time of bonding, external impacts and the like. Thus, there are problems in that reliable and accurate positioning with respect to the bumps 114 of the semiconductor element 112 cannot be maintained, yields are reduced, and connection failures occur.

In light of the above problems, Japanese Patent Application Laid-Open No. 11-40605 has proposed fixing distal end portions of inner leads to a polyimide film, to prevent deformation thereof. However, in this proposal, the inner leads are formed so as to traverse the device hole from both input sides and output sides, and the distal end portions thereof are fixed. Thus, there is a problem in that the inner leads cannot be formed densely, and the number of inner leads cannot be made large. This problem is important in view of the need to satisfy recent demands for high-level integration and miniaturization of semiconductor elements, and a solution is desired.

SUMMARY OF THE INVENTION

The present invention is provided to solve the above-described problems and a purpose is to achieve the following object. Specifically, an object of the present invention is to provide a semiconductor device in which a semiconductor element can be mounted with high reliability, high yield, and high levels of integration and miniaturization, and a fabrication method thereof.

The above purpose is satisfied by the following means. Specifically, a semiconductor device of the present invention is a semiconductor device including: a tape-form member including a first surface (rear surface) and a second surface (front surface); a semiconductor element mounted at the first surface of the tape-form member and including electrodes; and a plurality of inner leads formed at the second surface of the tape-form member and located at peripheral portions of the semiconductor element, the inner leads being electrically connected with the electrodes of the semiconductor element at the first surface of the tape form member, wherein an aperture for connection of the inner leads with the electrodes of the semiconductor element is formed in the tape-form member, the aperture for connection being formed at locations which do not coincide with locations of distal end portions of the inner leads, the distal end portions of the inner leads are fixed to the tape-form member, and the inner leads are electrically connected, through the aperture for connection from the first side of the tape-form member, with the electrodes of the semiconductor element.

In the semiconductor device of the present invention, it is suitable if the inner leads are formed at the second surface of the tape-form member and positioned at peripheral vicinity portions opposing the semiconductor element.

Further, the the aperture for connection may be formed in the tape-form member so as to be continuous substantially orthogonally to the inner leads, and the apertures for connection may be formed in the tape-form member in a one-to-one correspondence with the inner leads. When the apertures for connection are formed in the tape-form member in one-to-one correspondence with the inner leads, the inner leads and the electrodes of the semiconductor elements may be connected by a conductive adhesive.

Moreover, a device hole may be formed in the tape-form member and located at a central portion of the semiconductor element, the aperture for connection being formed at a peripheral vicinity of the device hole, or no device hole may be formed in the tape-form member.

According to a semiconductor device fabrication method of the present invention, a semiconductor device is provided with a semiconductor element mounted at a rear surface of a tape-form member and including electrodes, and a plurality of inner leads formed at a front surface of the tape-form member and located at peripheral portions of the semiconductor element, the inner leads being electrically connected with the electrodes of the semiconductor element at the rear surface of the tape form member. An aperture for connection of the inner leads with the electrodes of the semiconductor element is formed in the tape-form member, the aperture for connection being formed at locations which do not coincide with locations of distal end portions of the inner leads, the distal end portions of the inner leads are fixed to the tape-form member, and the inner leads are electrically connected, through the aperture for connection from the rear side of the tape-form member, with the electrodes of the semiconductor element.

In the semiconductor device of the present invention, inner leads are formed in the front surface of a tape-form member and located at peripheral portions of a semiconductor element that is to be mounted. The inner leads way be increased in number and may be formed at a closer pitch in accordance with the type of the semiconductor element that is to be mounted. Further, distal end portions of the inner leads are fixed at the tape-form member, and are connected to electrodes of the semiconductor element through a connection aperture. Consequently, problems with the distal end portions of the inner leads being deformed by heating during bonding, external impacts and the like are prevented. Thus, yield is increased with high reliability, and a highly integrated and miniaturized semiconductor element can be mounted.

DESCRIPTION OF THE PREFERRED EMBODIMENTS

Figure 1:
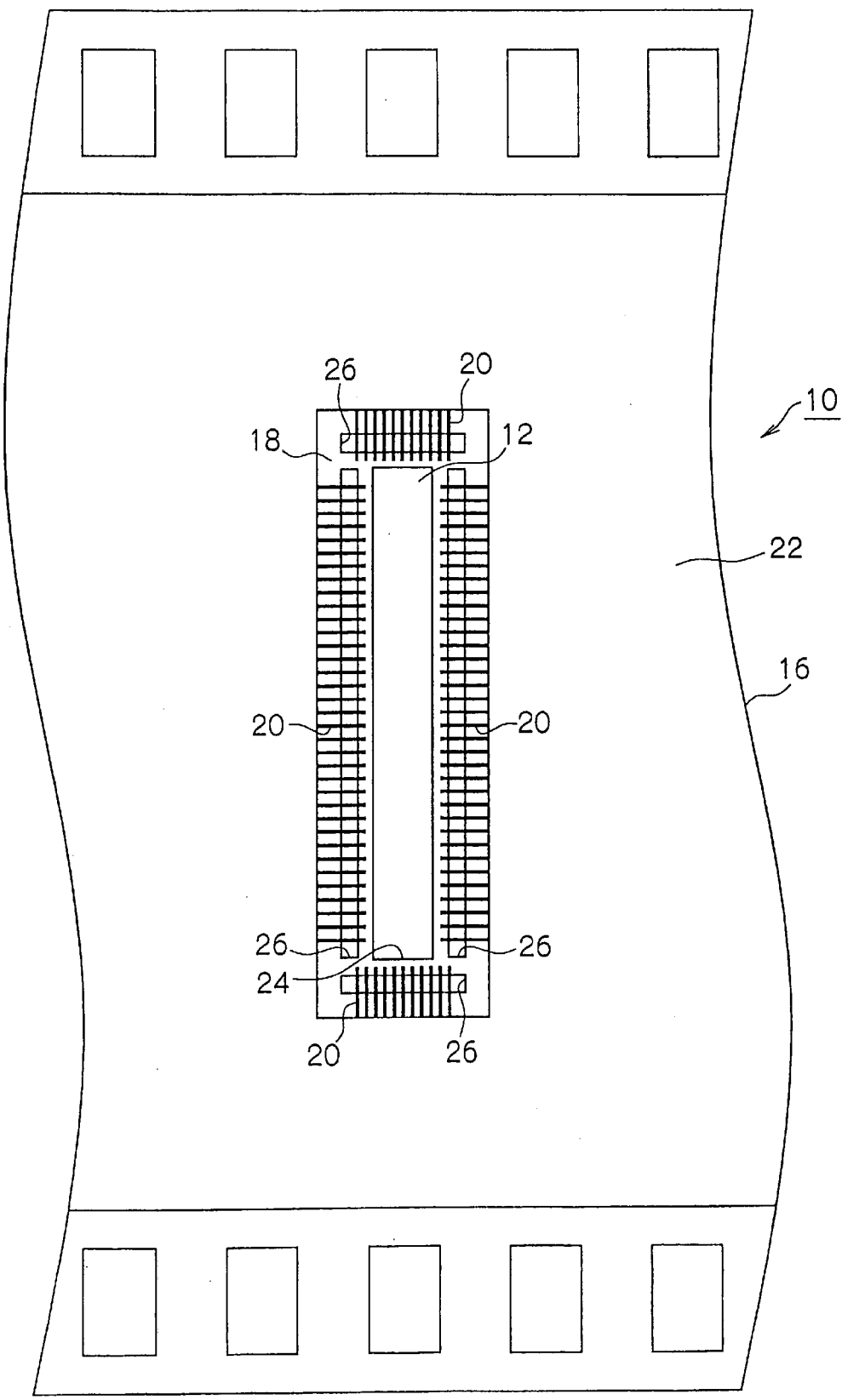
FIG. 1 is a plan view showing a semiconductor device relating to a first embodiment.
Figure 2A:
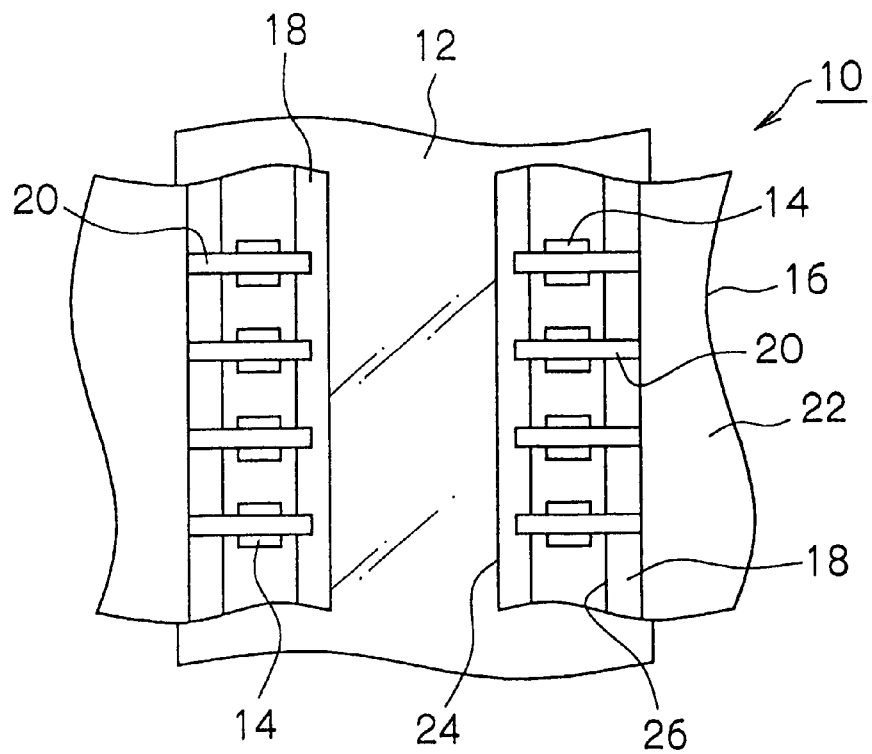
FIG. 2A is an enlarged plan view showing the semiconductor device relating to the first embodiment.
Figure 2B:
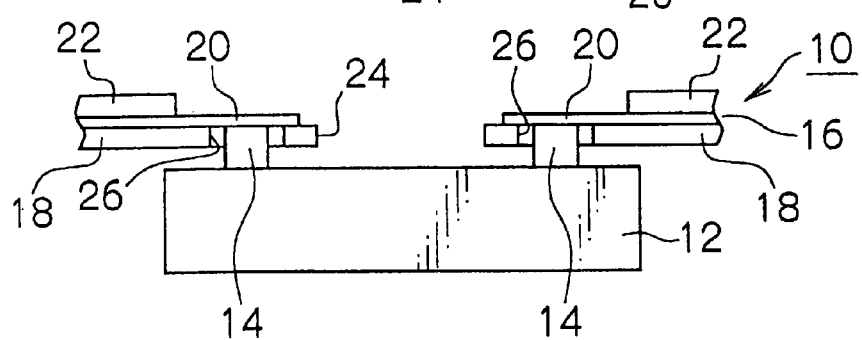
FIG. 2B is an enlarged sectional view showing the semiconductor device relating to the first embodiment.
Figure 3A:
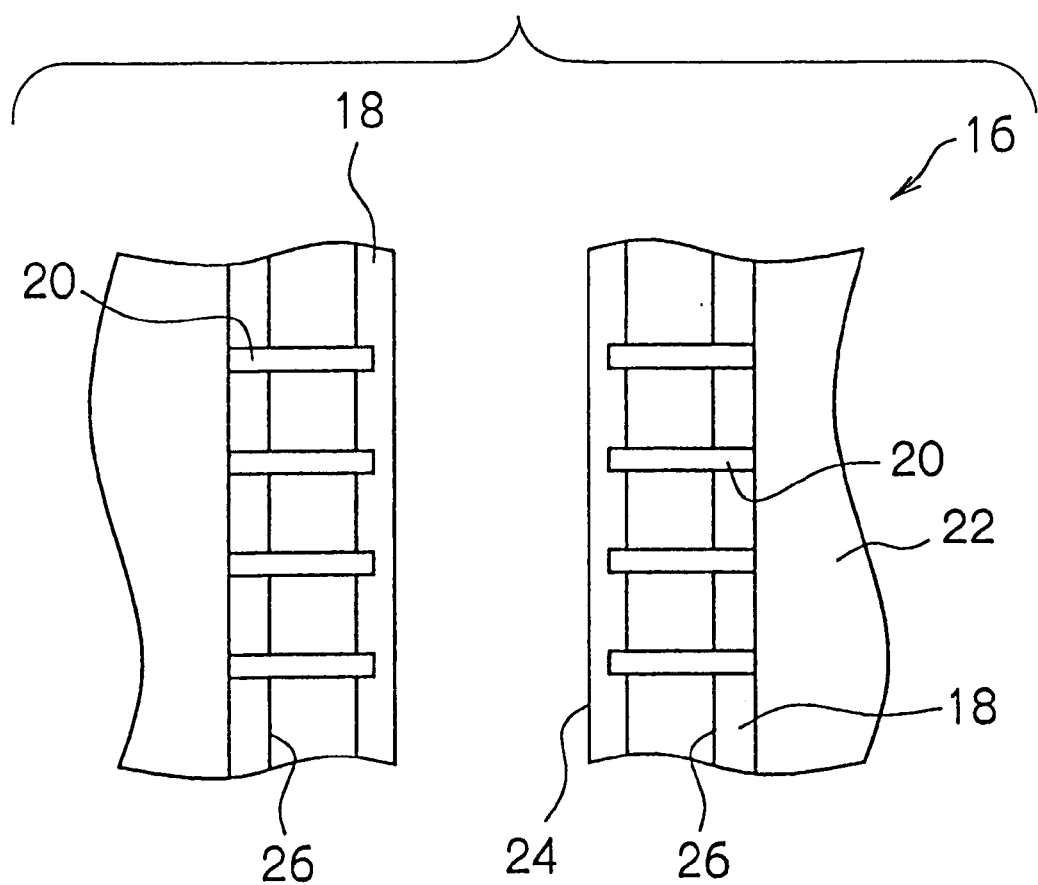
FIG. 3A is an enlarged plan view showing a TCP tape carrier of the semiconductor device relating to the first embodiment.
Figure 3B:
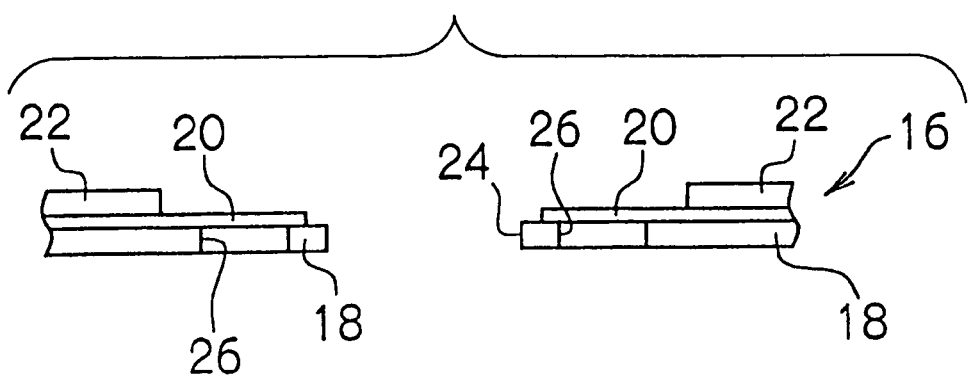
FIG. 3B is an enlarged sectional view showing the TCP tape carrier of the semiconductor device relating to the first embodiment.

Below, embodiments of the present invention are described with reference to the drawings In the descriptions, items that have substantially the same functions are given the same reference numerals throughout the drawings, and descriptions thereof may be omitted where appropriate.

First Embodiment

As shown in FIGS. 1, 2A, 2B, 3A and 3B, a semiconductor device 10 relating to a first embodiment has a form in which a quadrangular semiconductor element 12 is mounted at a rear side (a first side) of a TCP tape carrier 16 At the semiconductor element 12, bumps 14 (electrodes) for electrical connection to the exterior are formed on unillustrated bonding pads. The TCP tape carrier 16 is constituted with a base film 18 (a tape-form member), inner leads 20 and a resist 22. The base film 18 is formed of polyimide or the like. The inner leads 20 are formed at a front side (a second side) of the base film 18 and electrically connect between the semiconductor element 12 and the bumps 14. The resist 22 is formed so as to protect the inner leads 20.

The inner leads 20 are formed to be positioned at peripheral portions of each of vicinities that oppose the semiconductor element 12. The inner leads 20 are formed to substantially intersect the edges of the semiconductor element 12.

A device hole 24 and apertures for connection 26 are provided at the base film 18. The device hole 24 is for confirming and positioning a front surface of the semiconductor element 12 when the semiconductor element 12 is mounted to the base film 18. The apertures for connection 26 are for electrical connection between the inner leads 20 and the semiconductor element 12 via the bumps 14 when the semiconductor element 12 is mounted to the base film 18. The device hole 24 is provided so as to be positioned at a central portion of the semiconductor element 12. Four of the apertures for connection 26 are provided, at peripheral vicinities of the device hole 24. The apertures for connection 26 are formed so as to be located at peripheral vicinity portions of the semiconductor element 12, and are provided so as to be continuous in a direction substantially orthogonal to the inner leads 20. The apertures for connection 26 and the device hole 24 are provided at locations that do not coincide with distal end portions of the inner leads 20. The distal end portions of the inner leads 20 are fixed to the base film 18.

The semiconductor element 12 is electrically connected with the inner leads 20 via the bumps 14, through the apertures for connection 26 from the re side of the base film 18. Thus, the semiconductor element 12 is mounted to the TCP tape carrier 16.

Figure 4A:
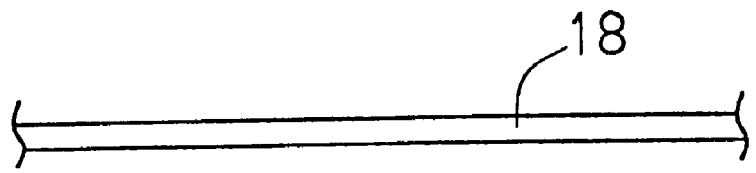
FIGS. 4A to 4C are process diagrams for explaining a fabrication method of the semiconductor device relating to the first embodiment
Figure 4B:
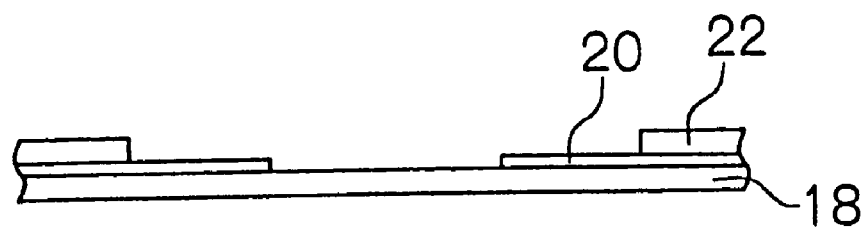

The semiconductor device 10 relating to the first embodiment may be fabricated, for example, as shown in FIGS. 4A to 4C and 5A to 5E. First, the base film 18 is prepared (FIG. 4A), and the inner leads 20 and the resist 22 are formed in that order on the base film 18 (FIG. 4B). The inner leads 20 may be provided by adhering a thin film of copper or the like, which has been patterned by photolithography or the like, to the base film 18 with an adhesive The inner leads 20 may alternatively be a patterned thin film of copper or the like which is directly provided on the base film 18 by a sputtering process, a CVD process or the like.

Figure 4C:
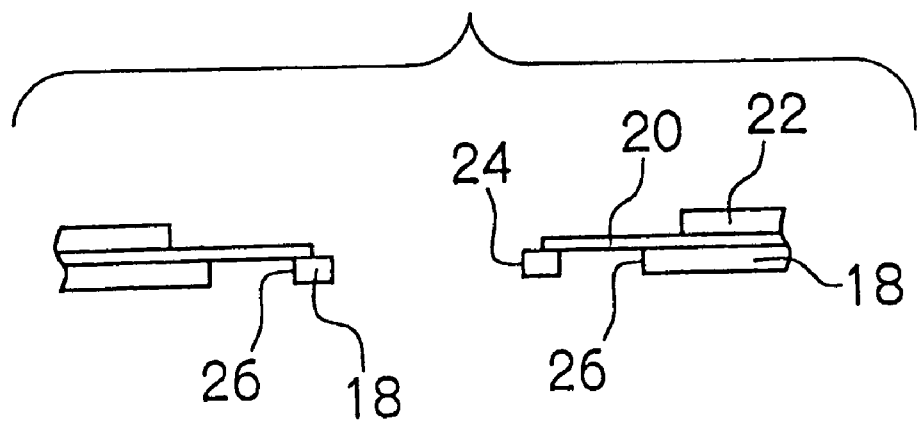

Next, the device hole 24 is formed in the base film 18 so as to be located at a central portion of the semiconductor element 12 when the semiconductor element 12 is mounted. Then, the four apertures for connection 26 are formed at the peripheral vicinities of the device hole 24, at locations corresponding to the peripheral vicinity portions of the semiconductor element 12, to be continuous substantially orthogonally with respect to the inner leads 20 (FIG. 4C). Here, as described above, the apertures for connection 26 and the device hole 24 are provided at locations that will not superpose with the distal end portions of the inner leads 20. The apertures for connection 26 and the device hole 24 can be easily formed using a die. Thus, the TCP tape carrier 16 is produced.

The apertures for connection 26 and the device hole 24 may be formed before or after formation of the inner leads 20.

Next, an inner lead bonding process (ILB process) is carried out as illustrated below, and the semiconductor element 12 is mounted to the TCP tape carrier 16.

Figure 5A:
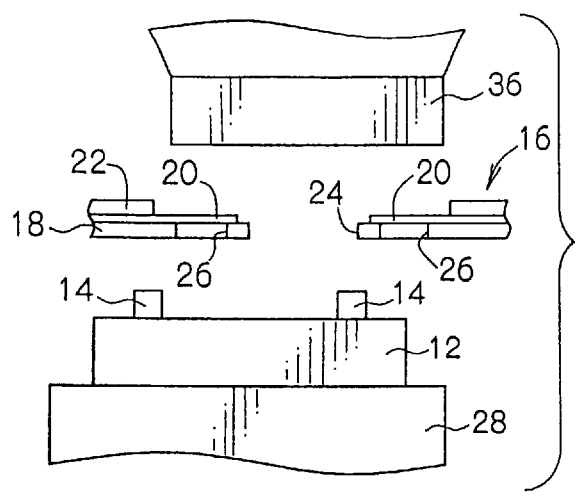
FIGS. 5A to 5E are process diagrams for explaining a fabrication method of the semiconductor device relating to the first embodiment.
Figure 5B:
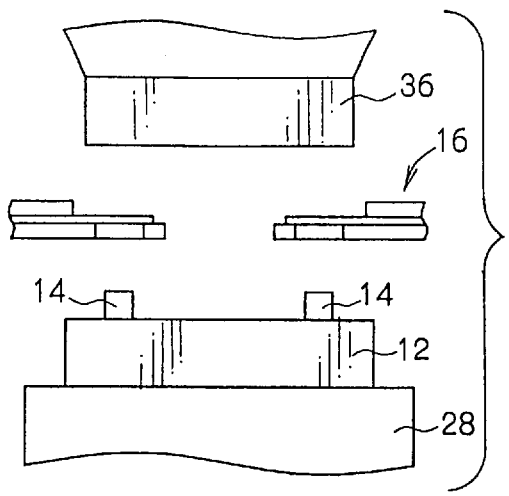
Figure 5C:
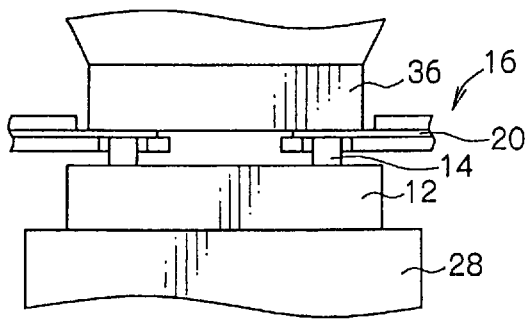
Figure 5D:
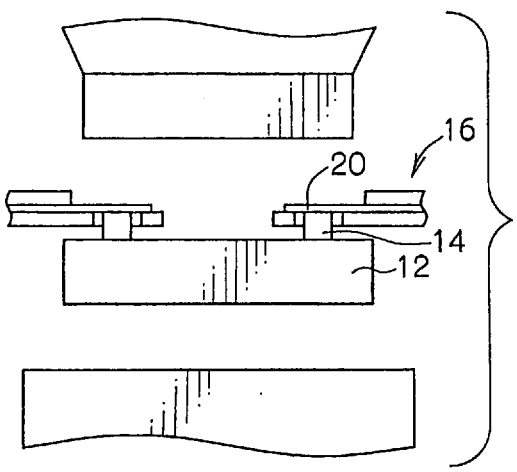
Figure 5E:
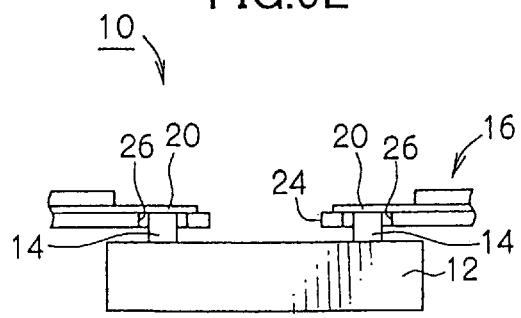
Figure 6A:
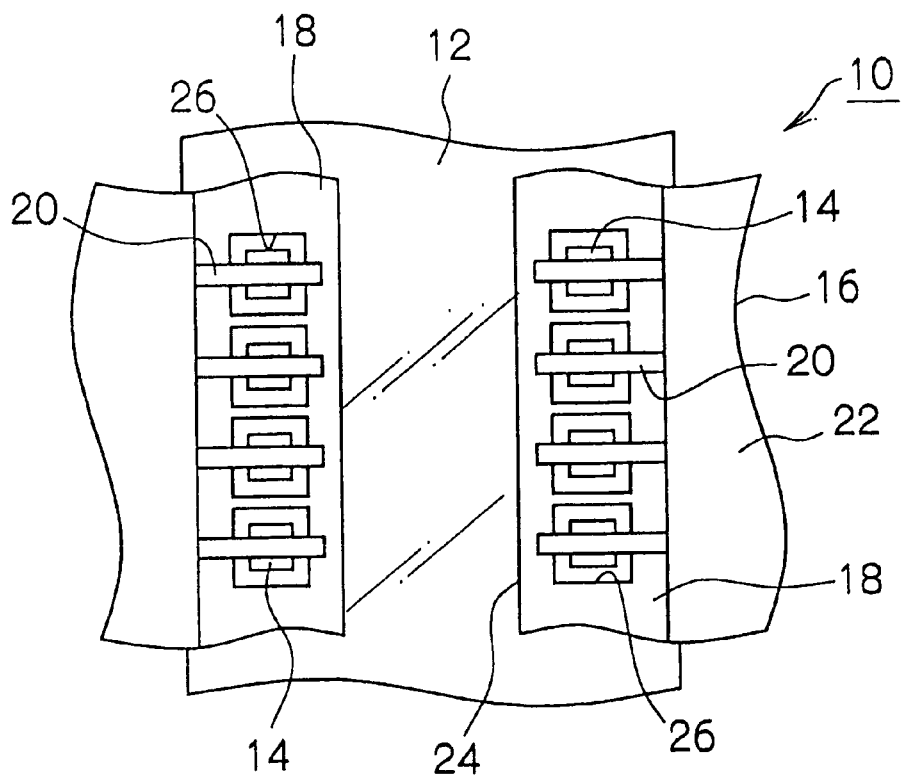
FIG. 6A is an enlarged plan view showing a semiconductor device relating to a second embodiment.
Figure 6B:
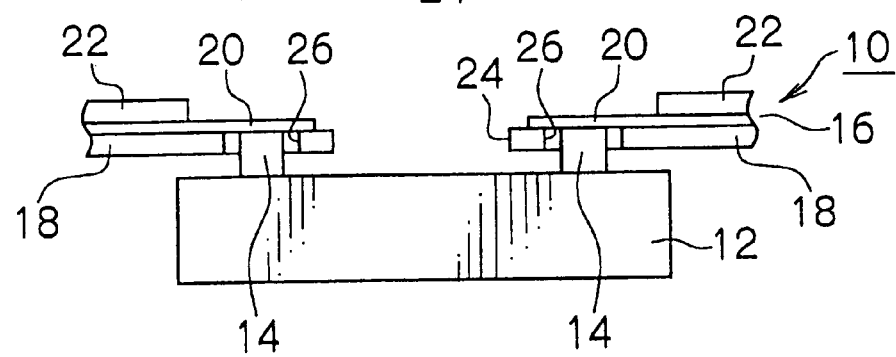
FIG. 6B is an enlarged sectional view showing the semiconductor device relating to the second embodiment.
Figure 7A:
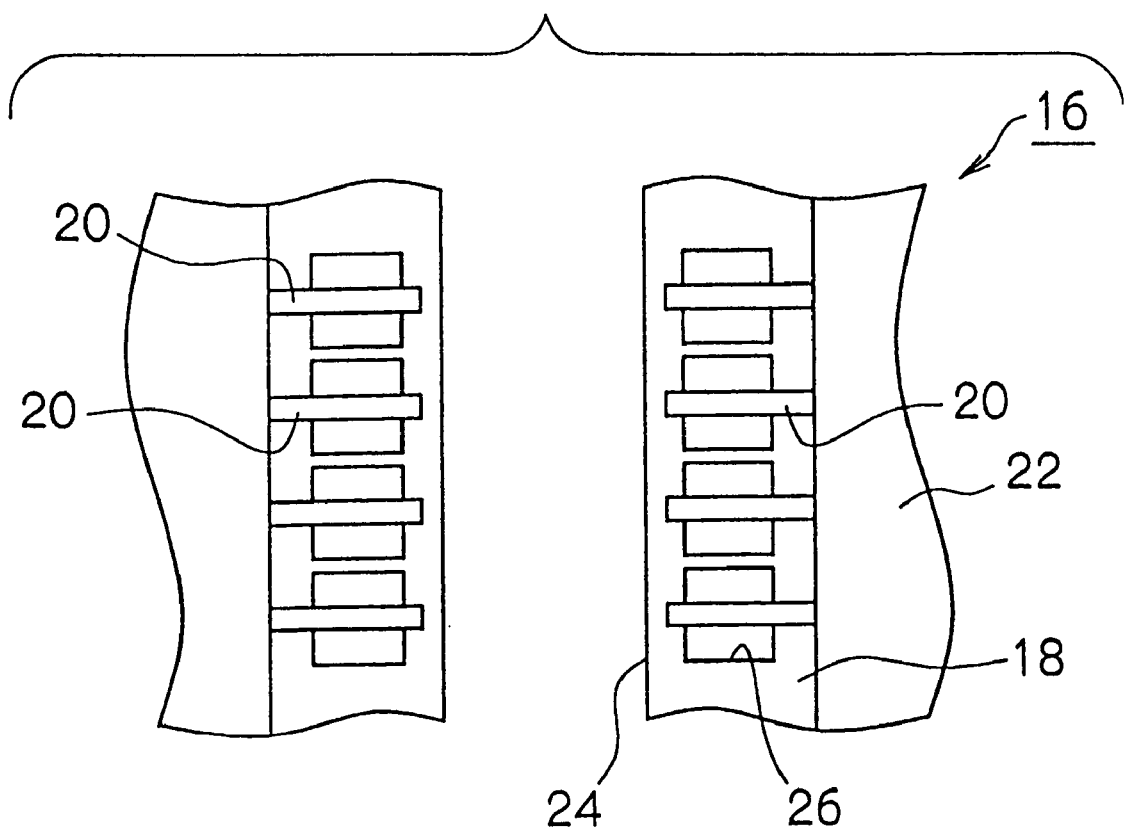
FIG. 7A is an enlarged plan view showing a TCP tape carrier of the semiconductor device relating to the second embodiment.
Figure 7B:
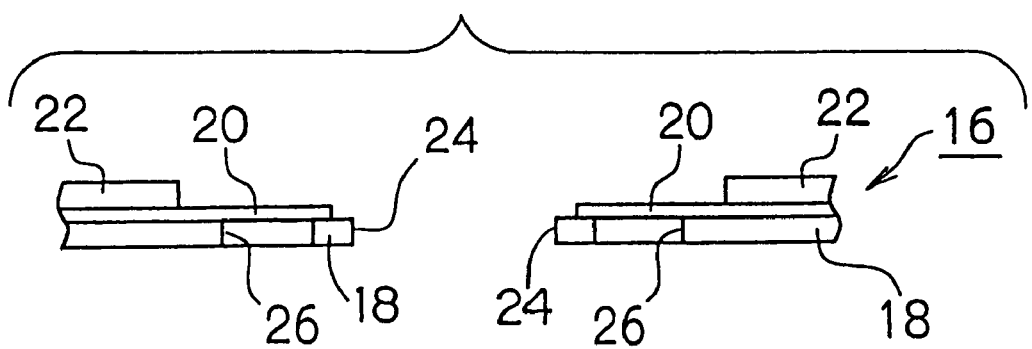
FIG. 7B is an enlarged sectional view showing the TCP tape carrier of the semiconductor device relating to the second embodiment.
Figure 8:
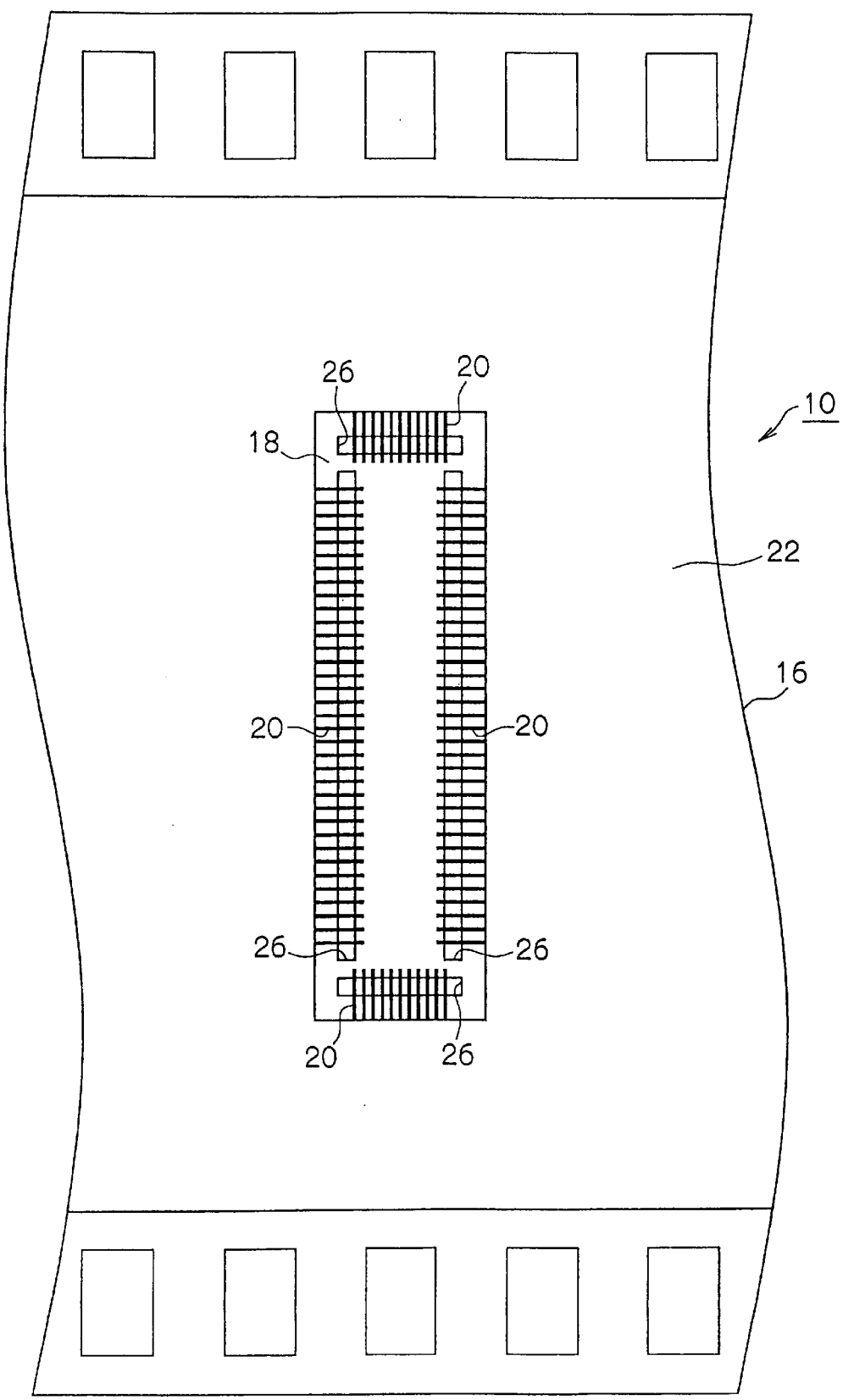
FIG. 8 is a plan view showing a semiconductor device relating to a third embodiment.
Figure 9A:
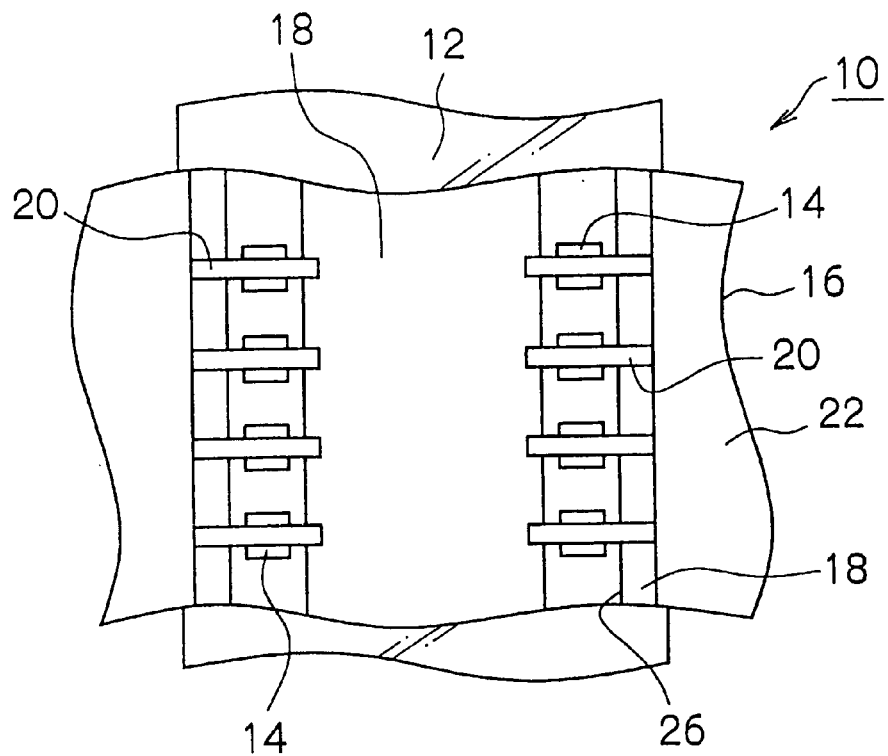
FIG. 9A is an enlarged plan view showing the semiconductor device relating to the third embodiment.
Figure 9B:
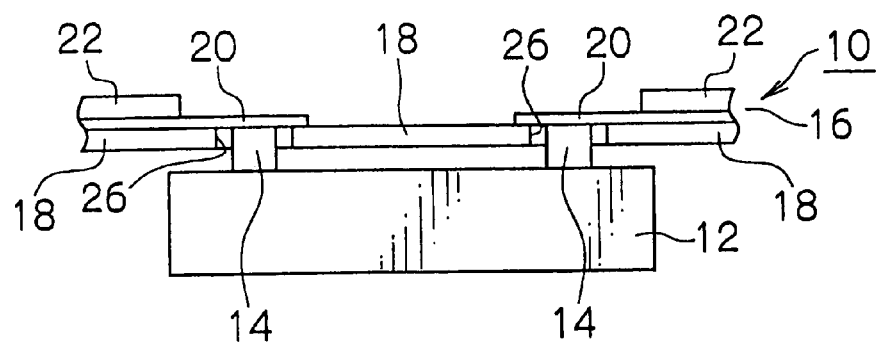
FIG. 9B is an enlarged sectional view showing the semiconductor device relating to the third embodiment.
Figure 10A:
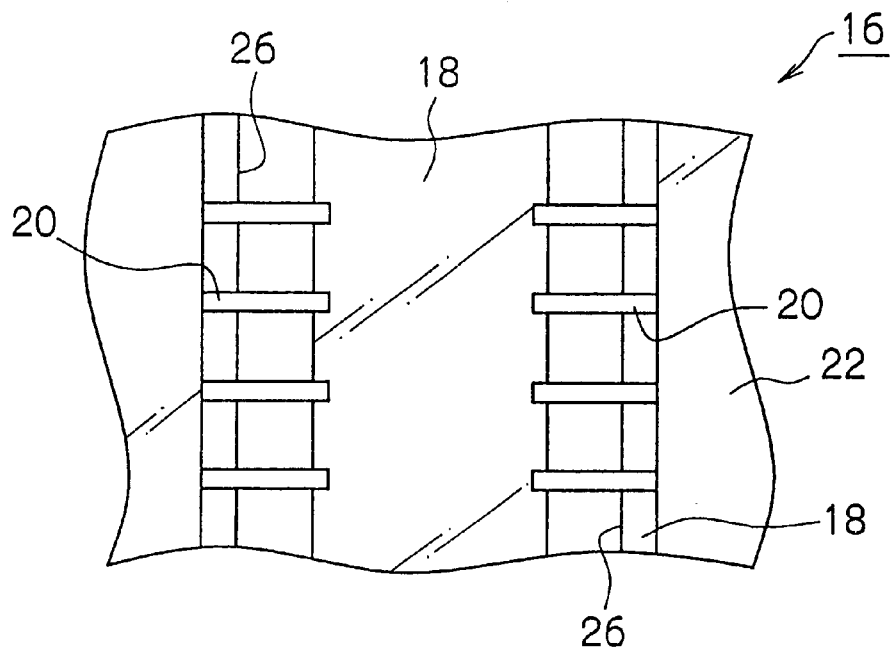
FIG. 10A is an enlarged plan view showing a TCP tape carrier of the semiconductor device relating to the third embodiment.
Figure 10B:
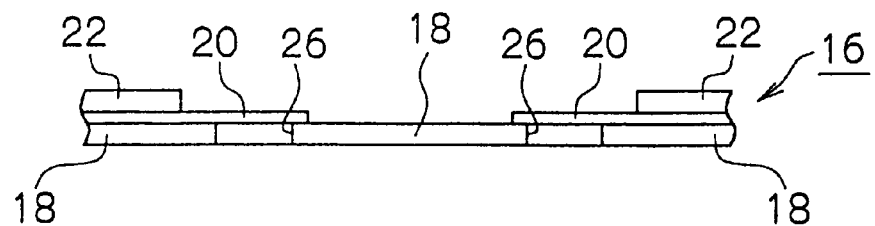
FIG. 10B is an enlarged sectional view showing the TCP tape carrier of the semiconductor device relating to the third embodiment.
Figure 11A:
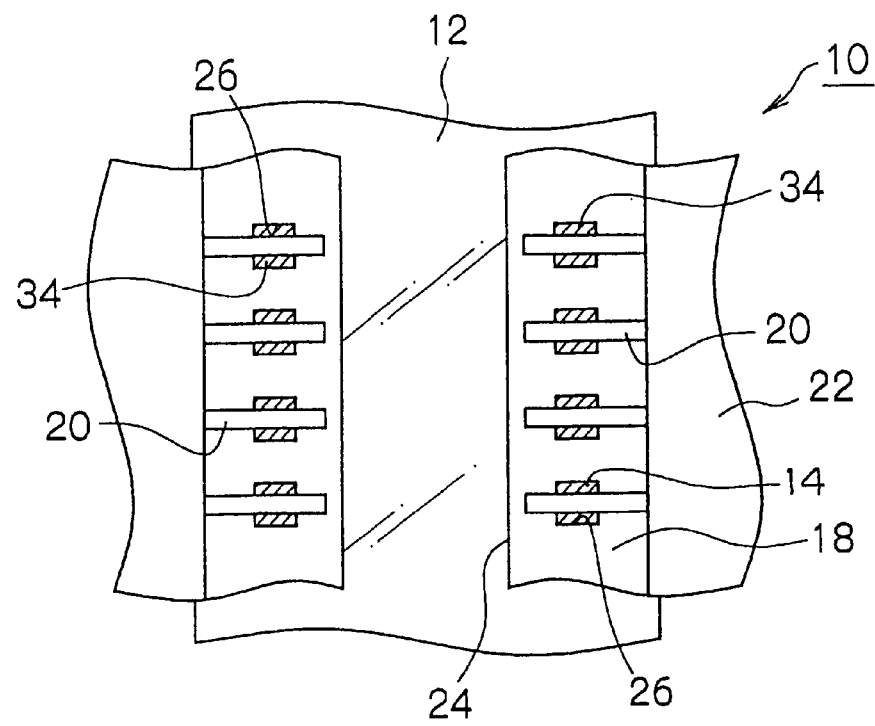
FIG. 11A is an enlarged plan view showing a semiconductor device relating to a fourth embodiment.
Figure 11B:
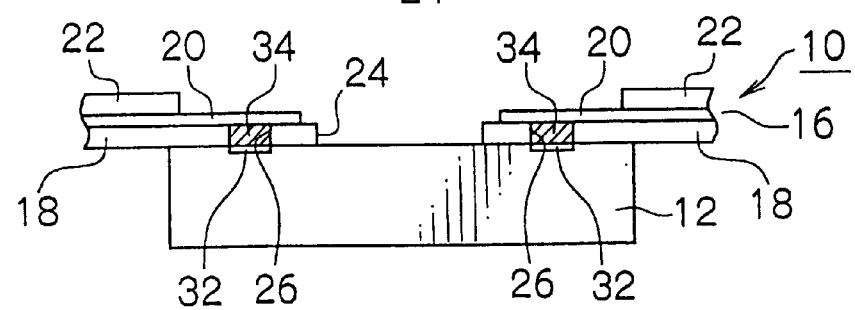
FIG. 11B is an enlarged sectional view showing the semiconductor device relating to the fourth embodiment.
Figure 12:
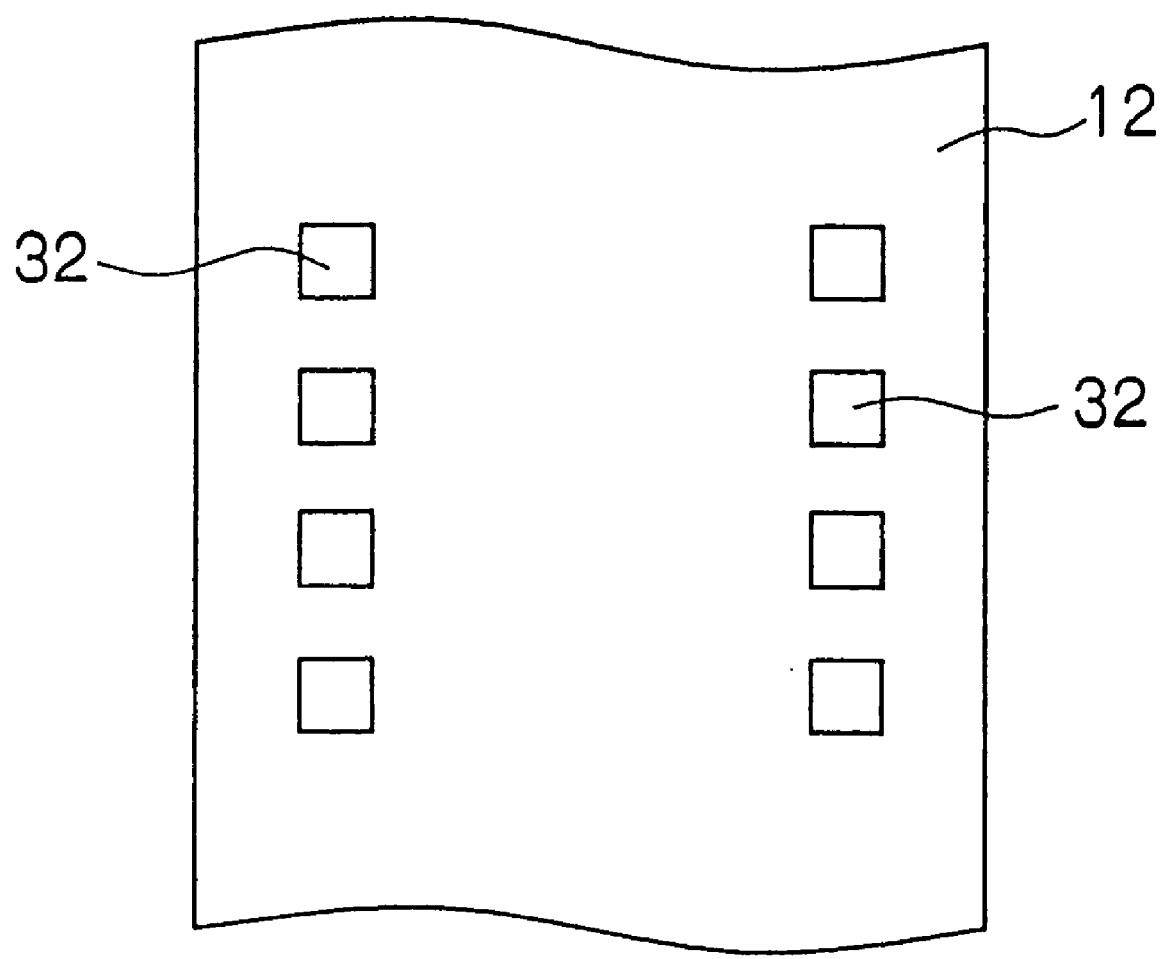
FIG. 12 is a plan view showing a semiconductor element of the semiconductor device relating to the fourth embodiment.
Figure 13A:
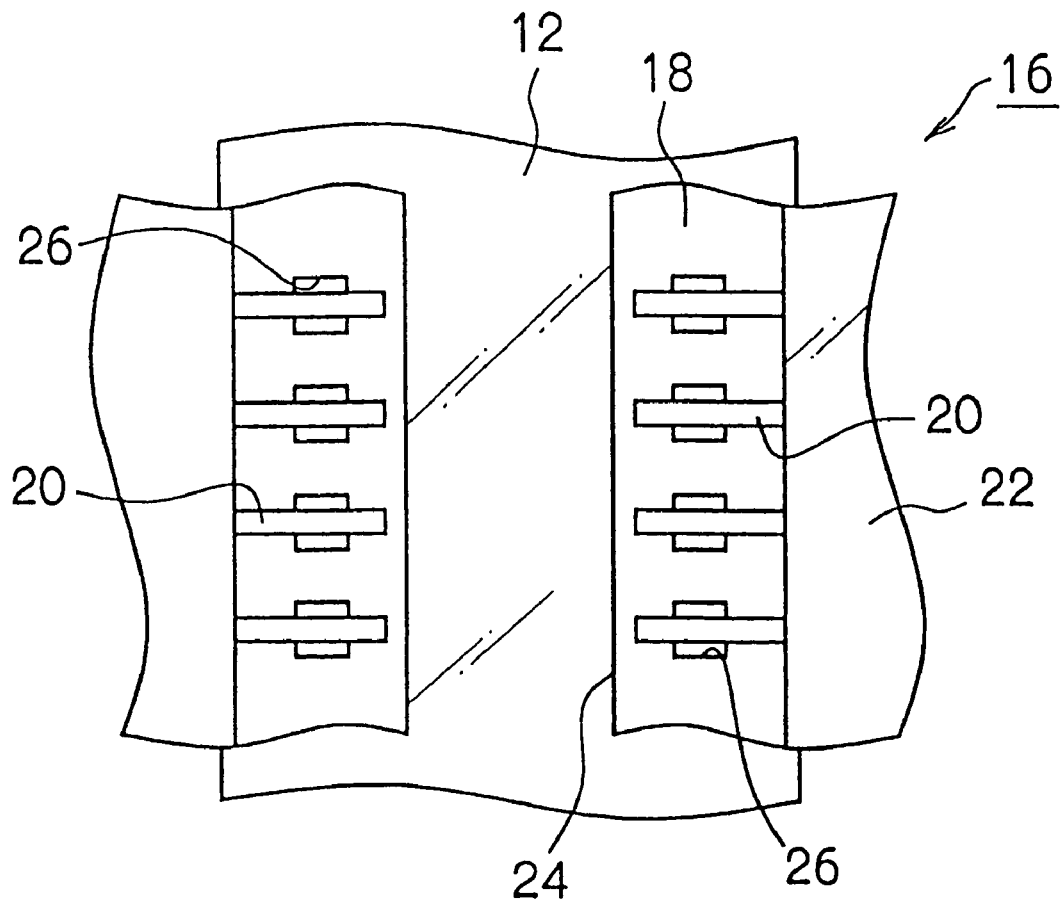
FIG. 13A is an enlarged plan view showing a TCP tape carrier of the semiconductor device relating to the fourth embodiment.
Figure 13B:
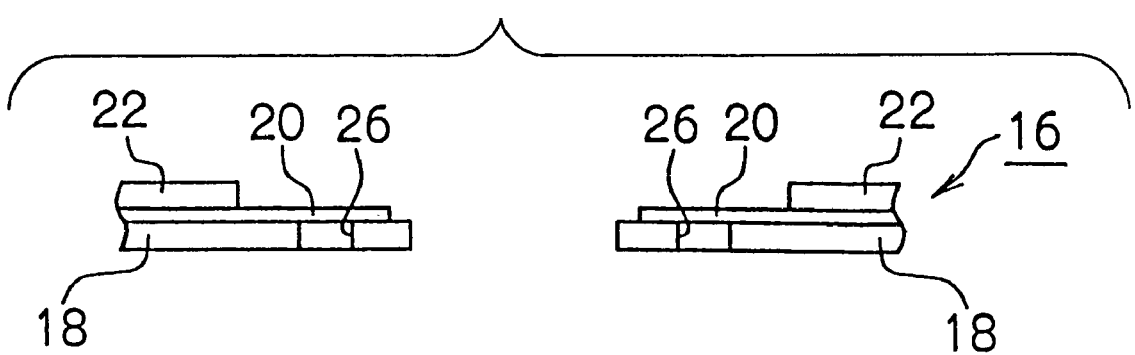
FIG. 13B is an enlarged sectional view showing the TCP tape carrier of the semiconductor device relating to the fourth embodiment.

Specifically, the semiconductor element 12 is disposed on a bonding stage 28 (FIG. 5A). The semiconductor element 12 that has been disposed on the bonding stage is moved to a bonding position. The semiconductor element 12 is moved, while the front surface of the semiconductor element 12 is detected through the device hole 24 by a camera for semiconductor element detection, and is finally positioned such that the inner leads 20 and the bumps 14 coincide (FIG. 5B). Thereafter, the bonding stage 28 is raised and a bonding tool 36 is lowered, and the bumps 14 are bonded with the inner leads 20 by thermocompression (FIG. 5C). Then, the bonding stage 28 is lowered and the bonding tool 36 is raised (FIG. 5D). Thus, the semiconductor element 12 is mounted at the TCP tape carrier 16 (FIG. 5E).

At the semiconductor device 10 relating to the first embodiment, the inner leads 20 are formed to be positioned at the peripheral portion vicinities opposing the semiconductor element 12, that is, at four peripheral portion vicinities. The number of the inner leads 20 may be increased and pitch may be made denser in accordance with the type of semiconductor element that is to be mounted. Further, the device hole 24 and the four apertures for connection 26 corresponding to the inner leads 20 at peripheral vicinities of the device hole 24 are formed in the base film 18 at locations that do not coincide with the distal end portions of the inner leads 20. Distal end portions of the inner leads 20 are fixed at the base film 18, and the inner leads 20 are connected to the bumps 14 of the semiconductor element through the apertures for connection 26. Consequently, problems with the distal end portions of the inner leads 20 being deformed by heating during bonding, external impacts and the like are prevented. Thus, yield is increased with high reliability, and a highly integrated and miniaturized semiconductor element can be mounted.

Moreover, because the semiconductor element 12 is mounted by connection with the inner leads 20 through the base film 18, the inner leads 20 do not make contact with edge portions of the semiconductor element 12, and edge short-circuits are prevented.

Second Embodiment

As shown in FIGS. 6A, 6B, 7A and 7B, the semiconductor device 10, which relates to a second embodiment, has the same form as the semiconductor device 10 relating to the first embodiment except that the apertures for connection 26 are provided in a one-to-one correspondence with the inner leads 20.

In the semiconductor device 10 relating to the second embodiment, the apertures for connection 26 are provided one for each of the inner leads 20. Thus, if the bumps 14 are excessively pressured due to unusual bonding conditions, devices or the like when the bumps 14 of the semiconductor element 12 are bonded (connected) with the inner leads 20, the excessively pressured bumps 14 are constrained by inner walls of the apertures for connection 26. Therefore, failures due to contacts between adjacent bumps 14, between adjacent inner leads 20, or between adjacent bumps 14 and inner leads 20 are prevented.

Furthermore, if, when the bumps 14 of the semiconductor element 12 are bonded with the inner leads 20, there is a positioning failure of the inner leads 20 relative to the bumps 14 and displaced bonding occurs, the bumps 14 are deformed so as to enter the respective apertures for connection 26 and are bonded. Thus, failures due to contacts between adjacent bumps 14, between adjacent inner leads 20, or between adjacent bumps 14 and inner leads 20 are prevented.

Third Embodiment

As shown in FIGS. 8, 9A, 9B, 10A and 10B, the semiconductor device 10, which relates to a third embodiment, has the same form as the semiconductor device 10 relating to the first embodiment except that the device hole 24 is not provided.

In the semiconductor device 10 relating to the third embodiment, problems with the distal end portions of the inner leads 20 being deformed by heating during bonding, external impacts and the like are prevented, as described above.

Fourth Embodiment

As shown in FIGS. 11A, 11B, 12, 13A and 13B, in the semiconductor device 10 relating to a fourth embodiment, the bumps 14 are not formed at the quadrangular semiconductor element 12 beforehand, and the semiconductor element 12 is only provided with bonding pads 32 (electrodes). This semiconductor element 12 is mounted from the rear side of the TCP tape carrier 16. The bonding pads 32 of the semiconductor element 12 are electrically connected with the inner leads 20 through the apertures for connection 26 by a conductive adhesive. Other structures are the same as in the semiconductor device 10 relating to the second embodiment. Here, sizes of the apertures for connection 26 are set to be the same or smaller than sizes of the bonding pads 32 of the semiconductor element 12.

In the semiconductor device 10 relating to the fourth embodiment, the semiconductor element 12 is mounted to the TCP tape carrier 16, for example, as shown in FIGS. 14A to 14E.

Figure 14A:
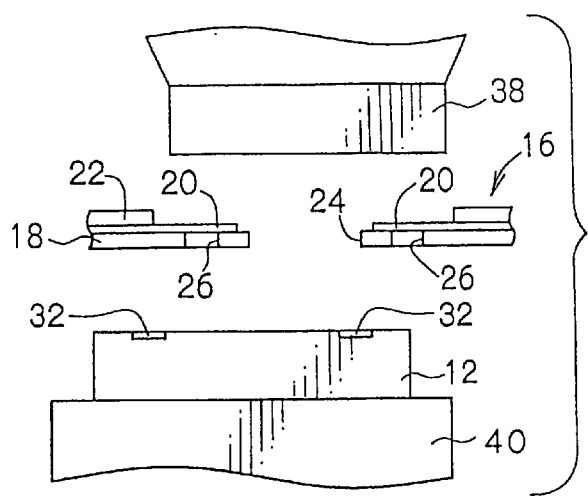
FIGS. 14A to 14E are process diagrams for explaining a fabrication method of the semiconductor device relating to the fourth embodiment.
Figure 14B:
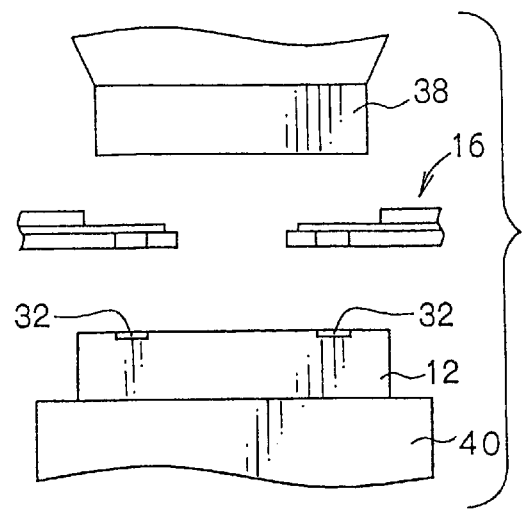
Figure 14C:
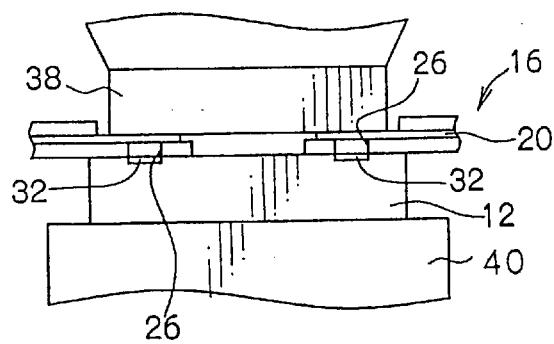
Figure 14D:
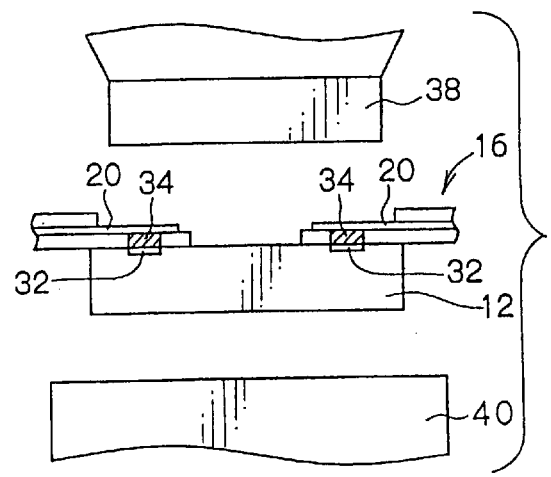
Figure 14E:
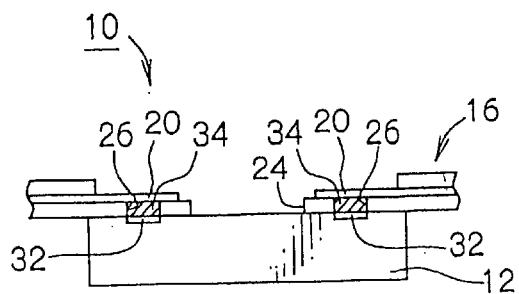
Figure 15:
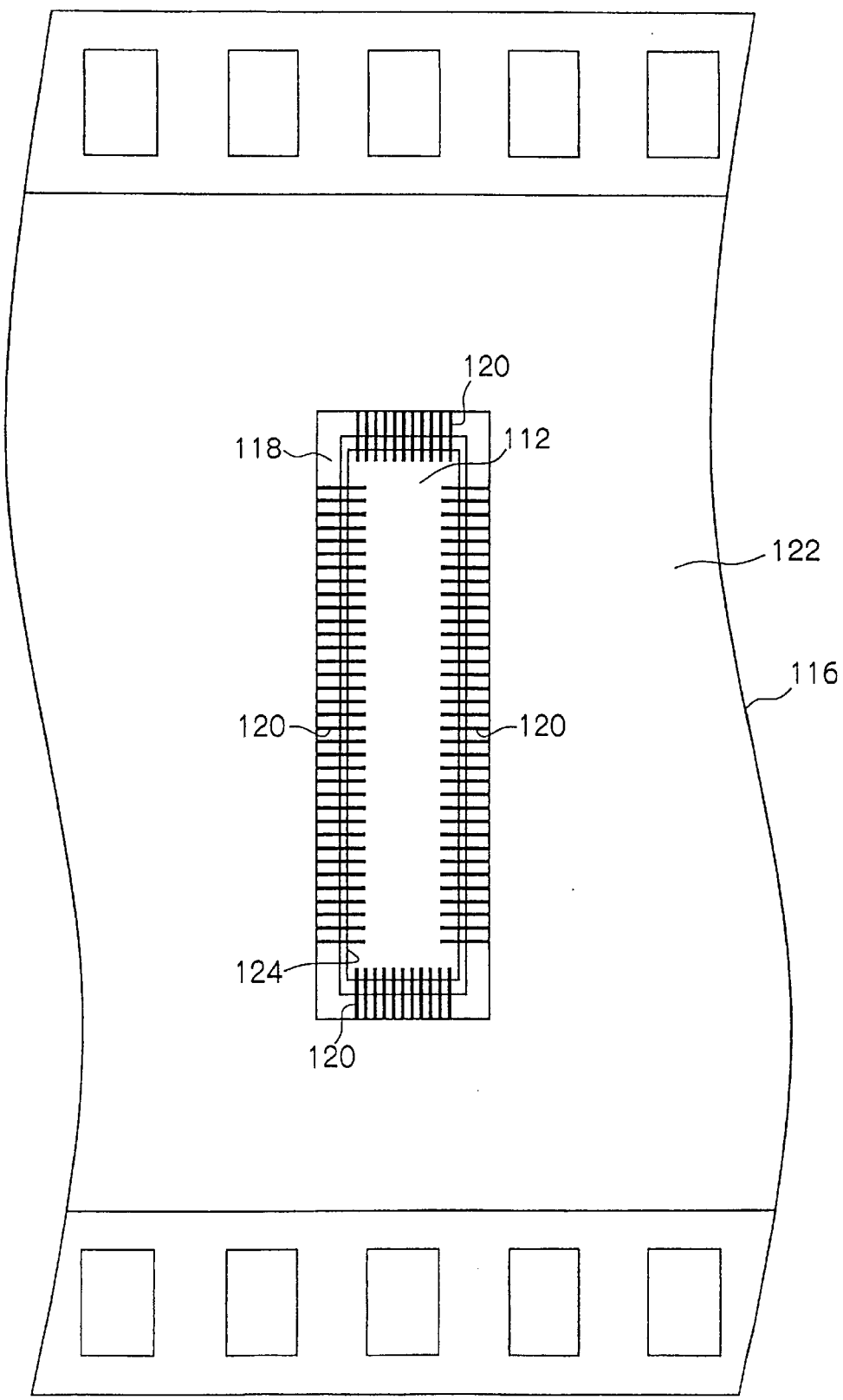
FIG. 15 is a plan view showing a semiconductor device relating to the prior art.
Figure 16A:
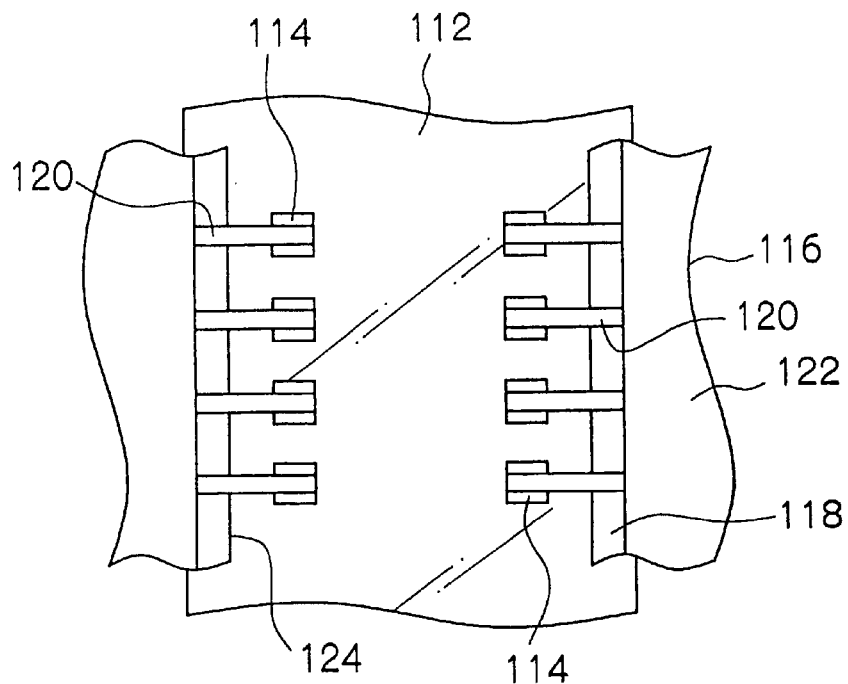
FIG. 16A is an enlarged plan view showing the semiconductor device relating to the prior art.
Figure 16B:
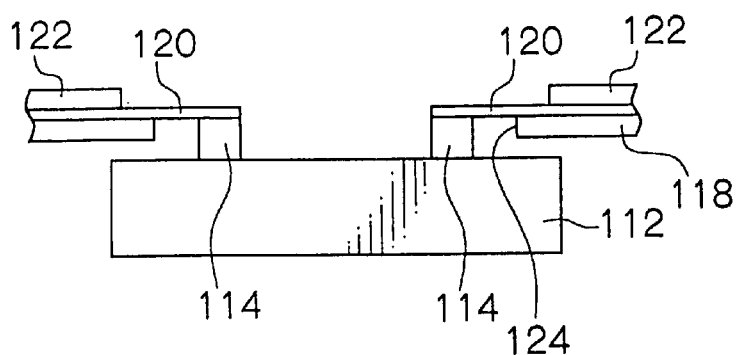
FIG. 16B is an enlarged sectional view showing the semiconductor device relating to the prior art.

Specifically, the semiconductor element 12 is first disposed on a stage 40 (FIG. 14A). Next, the semiconductor element 12 that has been disposed on the bonding stage is moved to a predetermined position. The semiconductor element 12 is moved, while the front surface of the semiconductor element 12 is detected through the device hole by a camera for semiconductor element detection, and is finally positioned such that the inner leads 20 and the bonding pads 32 coincide (FIG. 14B). Thereafter, the stage 40 is raised and a tool 38 is lowered, and the semiconductor element 12 is abutted against the TCP tape carrier 16 (FIG. 14C). Conductive adhesive 34 is introduced at the apertures for connection 26, and the bonding pads 32 and inner leads 20 are electrically connected. Then, the stage 40 is lowered and the tool 38 is raised (FIG. 14D). Thus, the semiconductor element 12 is mounted at the TCP tape carrier 16 (FIG. 14E).

In the semiconductor device 10 relating to the fourth embodiment, the bonding pads 32 of the semiconductor element 12 are electrically connected with the inner leads 20 by the conductive adhesive. Therefore, there is no need for bumps to be formed in advance at the semiconductor element 12 that is to be mounted, and semiconductor elements for other semiconductor devices which are already available on the market can be mounted without changes to wafer processing.

In the embodiments described above, explanations have been given for modes in which the inner leads 20 are formed at all four peripheral vicinity portions of the semiconductor element 12. However, the inner leads 20 could be formed facing only two peripheral vicinity portions of the semiconductor element 12. Moreover, the number and pitch of the inner leads 20 can, of course, be set in accordance to the type of the semiconductor element 12 that is to be mounted and, as described above, with the present invention a highly integrated and miniaturized semiconductor element can be mounted.

It should be noted that the present invention is not to be interpreted as being limited by the semiconductor devices and fabrication methods of any of the embodiments described above. The present invention refers to any implementation within ranges satisfying the principal conditions of the present invention.

What is claimed is:

1. A semiconductor device comprising:

a tape-form member including a first surface and a second surface, and including a device hole therethrough;

a semiconductor element mounted at the first surface of the tape-form member at a location corresponding to the device hole, the semiconductor element including electrodes; and a plurality of inner leads formed at the second surface of the tape-form member and located at peripheral portions of the semiconductor element, the inner leads being electrically connected with the electrodes of the semiconductor element at the first surface of the tape form member, wherein an aperture for connection of the inner leads with the electrodes of the semiconductor element is formed through the tape-form member, the inner leads extending across the aperture, the device hole being located at a central portion of the semiconductor element and the aperture being formed at a peripheral vicinity of the device hole, and the distal end portions of the inner leads are fixed to the tape-form member at a location apart from an edge of the device hole, and the inner leads are electrically connected through the aperture with the electrodes of the semiconductor element.

2. The semiconductor device of claim 1, wherein the inner leads are formed at the second surface of the tape-form member and positioned at peripheral vicinity portions of the tape-form member opposing the semiconductor element.

3. The semiconductor device of claim 1, wherein the aperture for connection is formed in the tape-form member so as to be continuous substantially orthogonally to the inner leads.

4. The semiconductor device of claim 1, comprising a plurality of apertures for connection formed in the tape-form member in one-to-one correspondence with the inner leads.

5. The semiconductor device of claim 4, wherein the inner leads and the electrodes of the semiconductor element are connected by a conductive adhesive.

6. A semiconductor device comprising:

a tape-form member including a first surface and a second surface;

a semiconductor element mounted at the first surface of the tape-form member and including electrodes; and a plurality of inner leads formed at the second surface of the tape-form member and located at peripheral portions of the semiconductor element, the inner leads being electrically connected with the electrodes of the semiconductor element at the first surface of the tape-form member, wherein an aperture for connection of the inner leads with the electrodes of the semiconductor element is formed through the tape-form member, the inner leads extending entirely across the aperture, the distal end portions of the inner leads are fixed to the tape-form member, and the inner leads are electrically connected through the aperture with the electrodes of the semiconductor element, and the tape-form member further including a member formed on the inner leads so as to sandwich the inner leads with the base film.

7. The semiconductor device of claim 6, wherein the inner leads are formed at the second surface of the tape-form member and positioned at peripheral vicinity portions opposing the semiconductor element.

8. The semiconductor device of claim 6, wherein the aperture is formed in the tape-form member so as to be continuous substantially orthogonally to the inner leads.

9. The semiconductor device of claim 6, comprising a plurality of apertures formed through the tape-form member in one-to-one correspondence with the inner leads.

10. The semiconductor device of claim 9, wherein the inner leads and the electrodes of the semiconductor element are connected by a conductive adhesive.

11. The semiconductor device of claim 6, wherein a device hole is formed through the tape-form member and located at a central portion of the semiconductor element, the aperture being formed at a peripheral vicinity of the device hole.

12. A semiconductor device comprising:

a tape-form member including a first surface and a second surface;

a semiconductor element mounted at the first surface of the tape-form member and including electrodes; and a plurality of inner leads formed at the second surface of the tape-form member and located at peripheral portions of the semiconductor element, the inner leads being electrically connected with the electrodes of the semiconductor element at the first surface of the tape-form member, wherein a plurality of apertures for connection of the inner leads with the electrodes of the semiconductor element are formed through the tape-form member in one-to-one correspondence with the inner leads, each of the inner leads extending entirely across one of the apertures, and the distal end portions of the inner leads are fixed to the tape-form member, and the inner leads are electrically connected through the apertures with the electrodes of the semiconductor element.

13. The semiconductor device of claim 12, wherein the inner leads are formed at the second surface of the tape-form member and positioned at peripheral vicinity portions opposing the semiconductor elements.

14. The semiconductor device of claim 12, wherein the inner leads and the electrodes of the semiconductor element are connected by a conductive adhesive.

15. The semiconductor device of claim 12, wherein a device hole is formed through the tape-form member and located at a central portion of the semiconductor element, the plurality of apertures being formed at a peripheral vicinity of the device hole.

* * * * *